(12) United States Patent
Palm

(10) Patent No.: US 9,613,930 B2
(45) Date of Patent: Apr. 4, 2017

(54) SEMICONDUCTOR DEVICE AND METHOD FOR MANUFACTURING A SEMICONDUCTOR DEVICE

(71) Applicant: Infineon Technologies AG, Neubiberg (DE)

(72) Inventor: Petteri Palm, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/064,093

(22) Filed: Oct. 25, 2013

(65) Prior Publication Data

US 2015/0115458 A1 Apr. 30, 2015

(51) Int. Cl.
*H01L 23/495* (2006.01)
*H01L 23/00* (2006.01)
(Continued)

(52) U.S. Cl.
CPC ............ *H01L 24/89* (2013.01); *H01L 21/486* (2013.01); *H01L 21/568* (2013.01); *H01L 23/5384* (2013.01); *H01L 23/5389* (2013.01); *H01L 24/09* (2013.01); *H01L 24/24* (2013.01); *H01L 24/31* (2013.01); *H01L 24/82* (2013.01); *H01L 24/97* (2013.01); *H01L 25/0655* (2013.01); *H01L 25/50* (2013.01); *H01L 21/561* (2013.01); *H01L 23/295* (2013.01); *H01L 23/49816* (2013.01); *H01L 24/32* (2013.01); *H01L 24/83* (2013.01); *H01L 2224/04105* (2013.01); *H01L 2224/05018* (2013.01); *H01L 2224/08112* (2013.01); *H01L 2224/08137* (2013.01); *H01L 2224/12105* (2013.01); *H01L 2224/24137* (2013.01); *H01L 2224/32245* (2013.01); *H01L 2224/73267* (2013.01); *H01L 2224/80031* (2013.01); *H01L 2224/8082* (2013.01); *H01L 2224/8085* (2013.01); *H01L 2224/80488* (2013.01); *H01L 2224/80801* (2013.01); *H01L 2224/80904* (2013.01); *H01L 2224/8203* (2013.01); *H01L 2224/83005* (2013.01); *H01L 2224/83203* (2013.01); *H01L 2224/83205* (2013.01); *H01L 2224/83801* (2013.01); *H01L 2224/83825* (2013.01);
(Continued)

(58) Field of Classification Search
CPC ..................................................... H01L 24/00
USPC ................... 257/678–798; 361/764
See application file for complete search history.

(56) References Cited

U.S. PATENT DOCUMENTS 5,504,372 A * 4/1996 Braden et al. ................. 257/723
5,841,190 A * 11/1998 Noda et al. .................... 257/678
(Continued)

*Primary Examiner* — Earl Taylor
*Assistant Examiner* — Samuel Park
(74) *Attorney, Agent, or Firm* — Dicke, Billig & Czaja, PLLC

(57) ABSTRACT

A device includes a first semiconductor chip including a first face, wherein a first contact pad is arranged over the first face. The device further includes a second semiconductor chip including a first face, wherein a first contact pad is arranged over the first face, wherein the first semiconductor chip and the second semiconductor chip are arranged such that the first face of the first semiconductor chip faces in a first direction and the first face of the second semiconductor chip faces in a second direction opposite to the first direction. The first semiconductor chip is located laterally outside of an outline of the second semiconductor chip.

15 Claims, 13 Drawing Sheets

(51) Int. Cl.
*H01L 25/065* (2006.01)
*H01L 25/00* (2006.01)
*H01L 23/538* (2006.01)
*H01L 21/48* (2006.01)
*H01L 23/29* (2006.01)
*H01L 21/56* (2006.01)
*H01L 23/498* (2006.01)

(52) U.S. Cl.
CPC ............... *H01L 2224/83851* (2013.01); *H01L 2224/83889* (2013.01); *H01L 2224/92244* (2013.01); *H01L 2224/97* (2013.01); *H01L 2924/10253* (2013.01); *H01L 2924/10271* (2013.01); *H01L 2924/10272* (2013.01); *H01L 2924/10329* (2013.01); *H01L 2924/12042* (2013.01); *H01L 2924/1305* (2013.01); *H01L 2924/13055* (2013.01); *H01L 2924/13062* (2013.01); *H01L 2924/13091* (2013.01); *H01L 2924/141* (2013.01); *H01L 2924/1431* (2013.01); *H01L 2924/1434* (2013.01); *H01L 2924/1461* (2013.01); *H01L 2924/15153* (2013.01); *H01L 2924/15747* (2013.01); *H01L 2924/181* (2013.01); *H01L 2924/18162* (2013.01)

(56) References Cited

U.S. PATENT DOCUMENTS

| | | | |
|---|---|---|---|
| 6,015,734 A | 1/2000 | Huang et al. | |
| 7,226,811 B1* | 6/2007 | McLellan et al. | 438/111 |
| 2006/0049509 A1* | 3/2006 | Tsukada | H05K 1/167 257/699 |
| 2010/0213599 A1* | 8/2010 | Watanabe et al. | 257/693 |
| 2011/0155433 A1* | 6/2011 | Funaya et al. | 174/258 |
| 2013/0043599 A1 | 2/2013 | Huang et al. | |
| 2013/0200528 A1* | 8/2013 | Lin | H01L 21/6836 257/774 |
| 2015/0041993 A1* | 2/2015 | Palm | 257/782 |

* cited by examiner

SEMICONDUCTOR DEVICE AND METHOD FOR MANUFACTURING A SEMICONDUCTOR DEVICE

TECHNICAL FIELD

The disclosure relates to semiconductor devices and methods for manufacturing semiconductor devices.

BACKGROUND

Microelectronic devices may include multiple semiconductor chips that may be of different size and form. The trend to higher integrated and more compact designs of microelectronic devices may require chip integration technologies providing large scale integration.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description. The elements of the drawings are not necessarily to scale relative to each other. Like reference numerals may designate corresponding similar parts.

DETAILED DESCRIPTION

Figure 1:
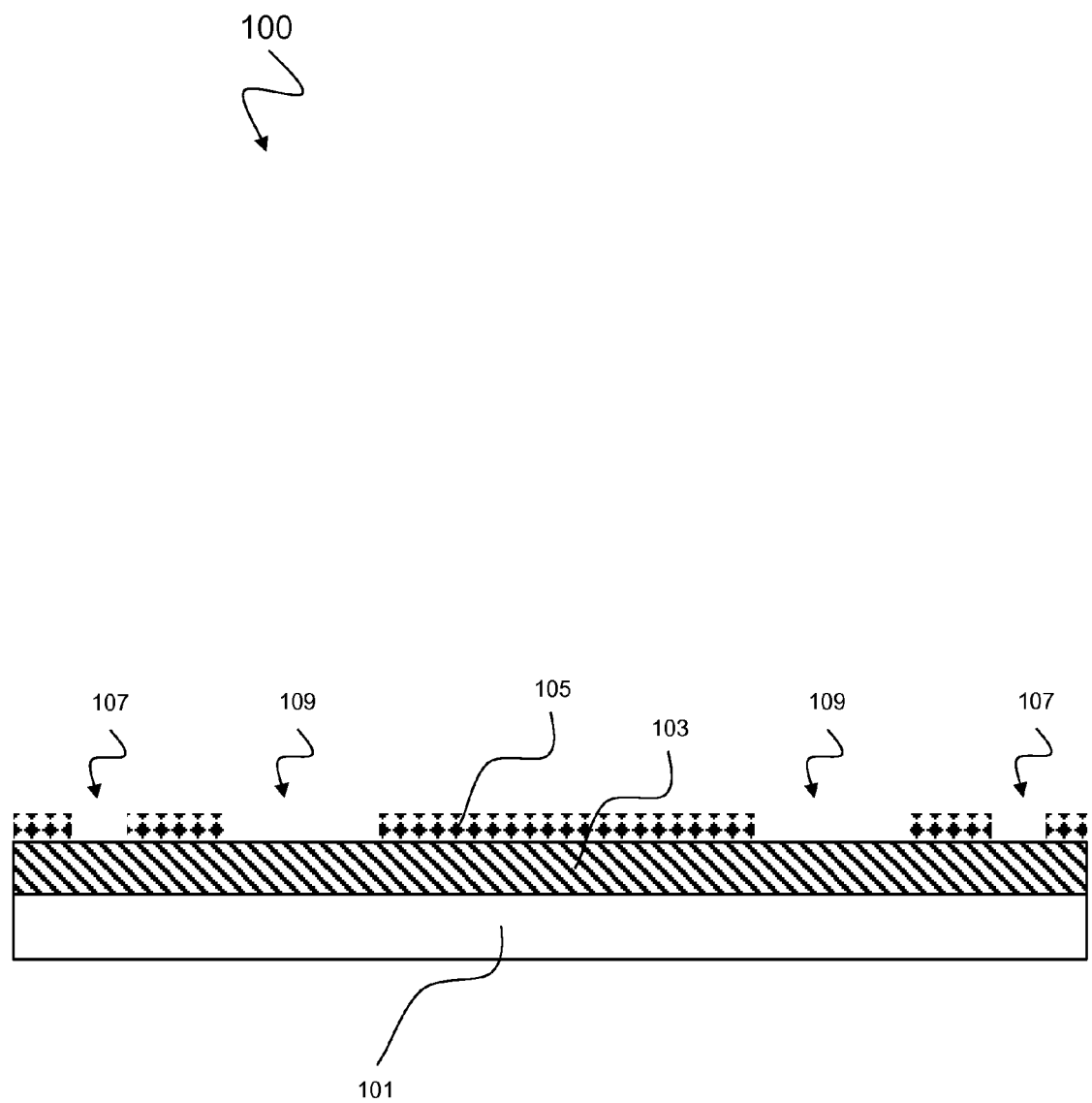
FIGS. 1 to 10 schematically illustrate cross-sectional views of a method for providing a core layer package embedding semiconductor chips of different size and form.

In the following detailed description, reference is made to the accompanying drawings, which form a part hereof, and in which is shown by way of illustration specific examples in which the disclosure may be practiced. In this regard, directional terminology, such as "top," "bottom," "front," "back," "leading," "trailing," etc., may be used with reference to the orientation of the figures being described. Because components of examples can be positioned in a number of different orientations, the directional terminology may be used for purposes of illustration and is in no way limiting. It is understood that other examples may be utilized and structural or logical changes may be made without departing from the concept of the present disclosure. The following detailed description, therefore, is not to be taken in a limiting sense.

The features of the various examples described herein may be combined with each other, unless specifically noted otherwise.

As employed in this specification, the terms "coupled" and/or "electrically coupled" are not meant to mean that the elements must be directly coupled together. Intervening elements may be provided between the "coupled" or "electrically coupled" elements.

Dies as described in the following may be small blocks of semiconductor material, on which a given functional circuit may be fabricated. Integrated circuits may be produced in large batches on a single wafer of electronic-grade silicon or other semiconductor material through processes such as photolithography. The wafer may be cut into many pieces, wherein each of these pieces may be referred to as a "die". Afterwards, one or more of the separated dies may be packaged. Packaging may involve attaching the die to a substrate, providing electrical connections to the die and providing a package at least partly encapsulating the die.

Devices containing multiple semiconductor chips, i.e. dies including a given functional circuit, are described in the following. It is noted that the terms "die", "semiconductor die", "chip" and "semiconductor chip" may be used synonymously in this specification. In particular, a die or semiconductor chip may include a power semiconductor. A power semiconductor chip is a specific type of semiconductor chip that may be designed to handle significant power levels. Power semiconductor chips may be particularly configured to switch and control currents and/or voltages. They may be implemented as power MOSFETs, IGBTs, JFETs, power bipolar transistors and diodes. Power semiconductor chips can be found in most power supplies, DC to DC converters and motor controllers, for example. Power semiconductor chips may be stacked on top of each other for specific applications, such as e.g. half-bridge circuits.

The semiconductor chips described herein may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (Micro-Electro Mechanical Systems) and may include micro-mechanical structures, such as bridges, membranes or tongue structures. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have electrodes on its two main faces, that is to say on its top side and bottom side. In particular, power semiconductor chips may have a vertical structure and may have load electrodes on both main faces. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or diodes. By way of example, the source electrode and gate electrode of a power MOSFET may be situated on one face, while the drain electrode of the power MOSFET may be arranged on the other face. In addition, the devices described herein may include integrated circuits configured to control the integrated circuits of the power semiconductor chips.

The semiconductor chips may have contact pads (or contact elements or terminals) which may allow an electrical contact to be made with the integrated circuits included in the semiconductor chips. The contact pads may include one or more metal layers that may be applied to the semiconductor material. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

One or more metal layers having the shape of conductor lines (or conductor tracks) may be provided and may be electrically coupled to the semiconductor chip. The metal layers may, for example, be used to produce a redistribution layer. The conductor lines may be employed as wiring layers to make electrical contact with the semiconductor chips from outside the device and/or to make electrical contact with other semiconductor chips and/or components contained in the device. The conductor lines may couple the contact pads of the semiconductor chips to the external contact pads. The conductor lines may be manufactured with any desired geometric shape and any desired material composition. Any desired metal, for example aluminum, nickel, palladium, silver, tin, gold or copper, or metal alloys may be used as the material. The conductor lines need not be homogenous or manufactured from just one material, that is to say various compositions and concentrations of the materials contained in the conductor lines are possible. Furthermore, the conductor lines may be arranged above or below or between electrically insulating layers.

The devices described below may include external contact pads (or external contact elements), which may be of any shape and size. The external contact pads may be accessible from outside the devices and may thus allow electrical contact to be made with the semiconductor chips from outside the devices. The external contact pads may be composed of any desired electrically conductive material, for example of a metal, such as copper, aluminum or gold, a metal alloy or an electrically conductive organic material. The external contact pads may be formed by portions of the metal layers. Solder material, such as solder balls or solder bumps, may be deposited on the external contact pads.

The semiconductor chips or at least parts of the semiconductor chips may be covered with an encapsulation material, which may be electrically insulating and which may form an encapsulation body. For example, the encapsulation material may include at least one of a prepreg, a resin and a laminate.

The devices described herein may include at least one mounting surface. The mounting surface may serve to mount the device onto another component, for example, a circuit board, such as a PCB (Printed Circuit Board). External contact elements and, in particular, external contact surfaces may be disposed on the mounting surface to allow to electrically couple the device to the component on which the device is mounted. Solder deposits, such as solder balls, or other appropriate connection elements may be used to establish an electrical and, in particular, mechanical connection between the device and the component on which the device is mounted.

The method described below with respect to FIGS. 1 to 10 may be referred to as "embedding process".

FIGS. 1 to 10 schematically illustrate cross-sectional views of a method for providing a core layer package embedding semiconductor chips of different size and form.

FIG. 1 schematically illustrates an exemplary lithography act 100. A base material may be a plated conductive foil 103 on a carrier 101 such as a Cu (Copper) foil 103 on an Al (Aluminum) carrier 101. In one example, the panel may have a size of approximately 400 mm×300 mm. The thickness of the Cu foil may be selected according to the die thickness and may have an exemplary thickness in the range between 50 μm (micrometer) and 80 μm (micrometer). In one example, the Al carrier 101 may have a thickness of 100 μm (micrometer). In one example, the Al carrier 101 may have a thickness between 50 μm (micrometer) and 200 μm (micrometer).

The first process step may be a lamination of a solder resist 105. After the lamination the resist 105 may be exposed by using a mask aligner or LDI (Laser Direct Imaging). After the exposure the resist 105 may be developed and removed from dicing streets 107 and an area 109 where dies may be embedded in a later process step. If required, the resist 105 may also be removed from the areas where additional openings are required in a later process step, for example for providing through holes.

In one example the foil 103 may be a metal foil such as a copper (Cu) foil, an aluminum (Al) foil, a silver (Ag) foil, a nickel (Ni) foil, a palladium (Pd) foil, a gold (Au) foil or a multilayer foil including a combination of such metals, e.g. one of the following: Ni, Pd and Au; Ni and Pd; Ni and Au; Ni, Pd, Ag and Au; Cu, Pd and Ni. The carrier 101 may be a Cu or Al foil or a steel carrier having a thickness from about 40 to about 200 μm (micrometer). On the top surface the functional foil 103 may be electroplated. In other examples the Cu or Al foil may have an exemplary thickness of about 35 to 60 μm (micrometer), 35 to 80 μm (micrometer), 25 to 70 μm (micrometer), 50 to 90 μm (micrometer), 45 to 60 μm (micrometer), 25 to 80 μm (micrometer), 10 to 100 μm (micrometer), 5 to 200 μm (micrometer), 35 to 200 μm (micrometer), 5 to 300 μm (micrometer), 5 to 400 μm (micrometer) or other values. In one example, a thin plated (e.g. chromium) release layer (not shown in FIG. 1) may be arranged between the functional foil 103 and the carrier 101. Such release layer may be used for removing the carrier easily by pealing after the later process steps.

Figure 2:
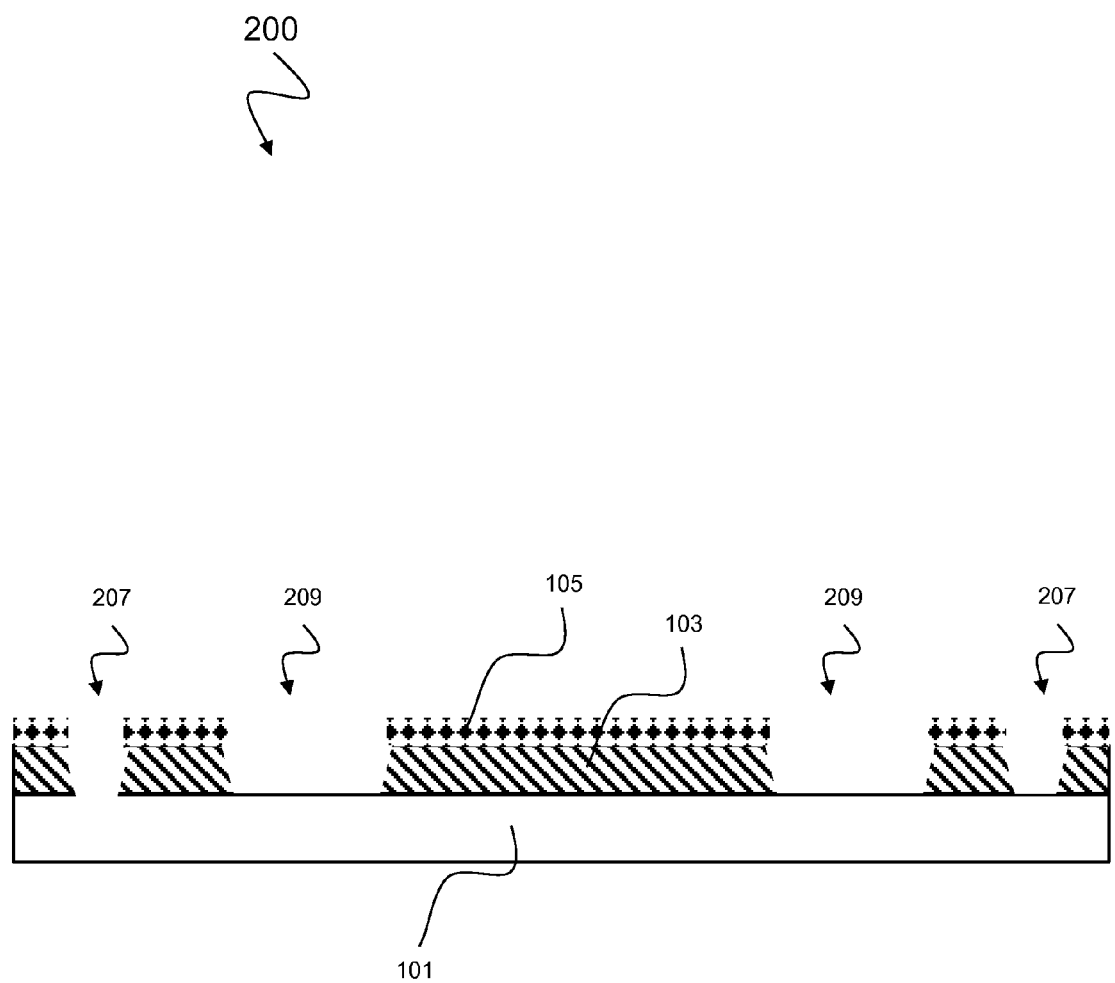

FIG. 2 schematically illustrates an exemplary act 200 of etching.

After the photolithography process 100 first openings 209 may be manufactured by using a selective Cu etching process 200, for example. The first openings 209 may be provided for thick components which may be embedded inside the first openings 209 in a later process step. Similarly, the second openings 207 for the dicing streets may be etched. In another example, depending on the process chemistry the etching 200 may be performed in two phases so that in the first phase the cavity is "half etched" with a high speed and an aggressive (non-selective) etchant and the final 5 to 10 μm (micrometer) may be etched with a slower but selective etchant in the second phase. The final phase in this process step may be the photoresist removal and cleaning of the foil 103.

A panel as produced after the etching act 200 may include multiple first openings 209 for the thick components and multiple second openings 207 for the dicing streets. The openings 207, 209 may be arranged on the panel in the form of a grid. In one example, each element of the grid including a first opening 209 may be surrounded by elements of the grid having no first opening 209.

Figure 3:
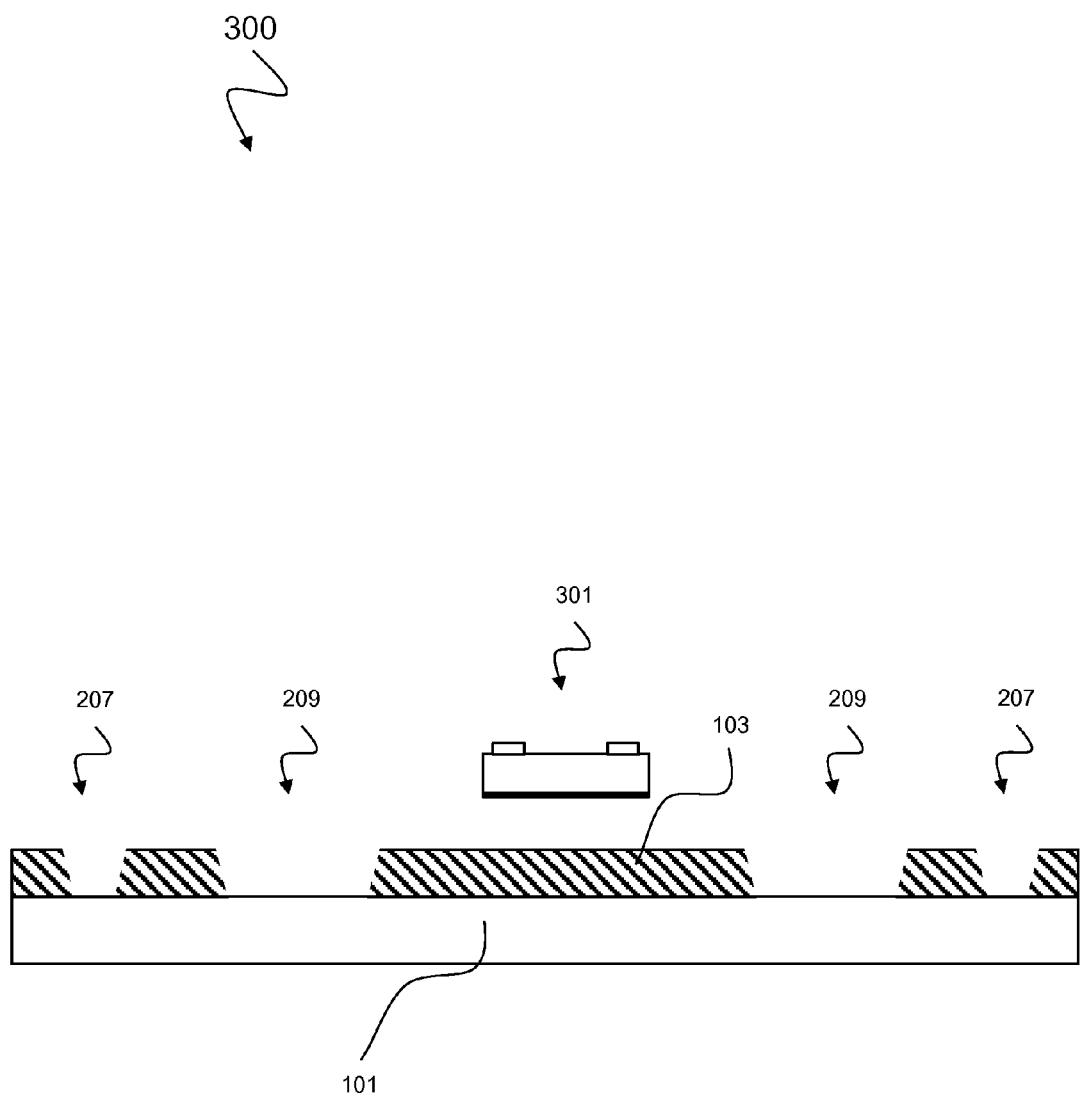

FIG. 3 schematically illustrates an exemplary act 300 of bonding. Dies 301 may be bonded to the Cu land, i.e. a non-removed, e.g. non-etched surface of the Cu foil 103 by using a diffusion soldering process, for example. In FIG. 3 a single semiconductor chip 301 is depicted which may be bonded to a non-etched surface of the Cu foil 103. Other attaching processes such as diffusion bonding, soldering, conductive adhesive attaching, ultrasonic bonding, thermal compression may be used alternatively or in addition.

In case that a die bonder is used, the large panel as described above can be cut to leadframe size. In an exemplary process the panel side may be the same as used in PCB processes. In addition to the die bonding process a batch die attach process may be used. If the thin dies do not require a back side connection, an isolation glue die bonding process can be used. A first semiconductor chip 301 as depicted in FIG. 3 may be called "thin die" or "thin semiconductor chip", because its thickness may be smaller than a second semiconductor chip 401 as described below with respect to FIGS. 4 to 10. The latter one may be called "thick die" or "thick semiconductor chip" in this disclosure.

Figure 4:
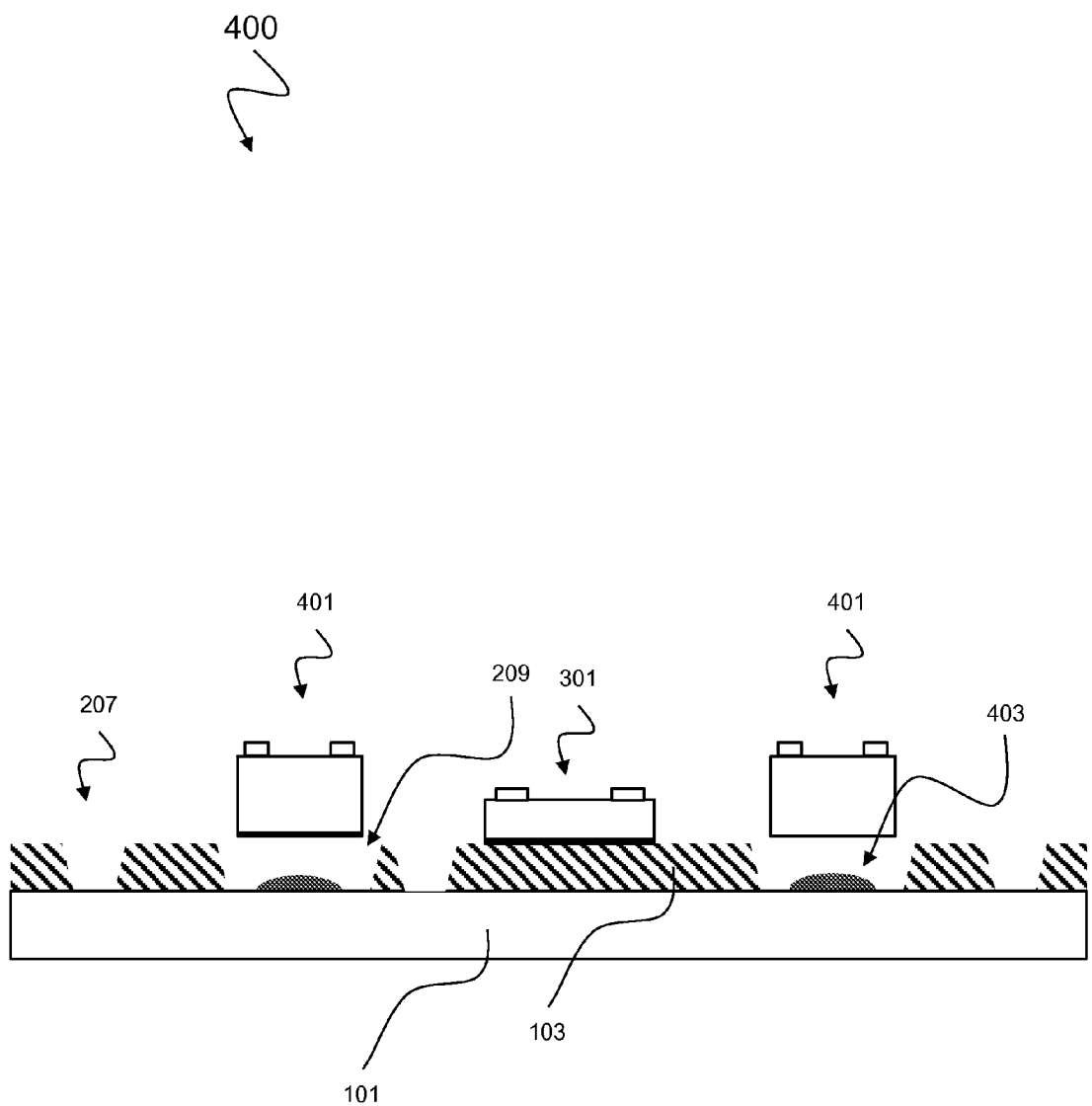

FIG. 4 schematically illustrates an exemplary act 400 of die attaching. Although FIG. 4 illustrates one thin die 301 and two thick dies 401, any other number of thin dies 301 and thick dies 401 may be attached to the carrier 101 or to the foil 103, for example one thick die and two thin dies, one thin die and one thick die, two thin dies alone, two thick dies alone or any other combination. The thick dies 401 may be mounted inside the cavity 209 in the Cu foil 103 and bonded to the aluminum foil 101, e.g. by using insulating glue 403. The glue 403 may be dispensed inside the cavity 209 by using e.g. an ink jet type dispenser. The thick dies 401 may be mounted on top of the adhesive 403 by using a high speed and accurate pick and placement machine. The adhesive 403 may be cured by using a reflow or batch oven. The aligning marks for the adhesive 403 dispensing and component placement may be manufactured at the same time together with the cavity etching process 200 as described above with respect to FIG. 2. In one example, the adhesive 403 may be pre-applied on the wafer backside, e.g. by using DAF (Die Attach Film) before the die attaching process 400. The purpose of the adhesive 403 may be either to "temporarily" fix the dies 401 to their correct location, in case the back side will be connected to the conductor layer 103 later by plating, or to fix and isolate the dies 401 from the conductor layer 103, e.g. as in the case of the dies 401 serving as controller or driver dies 401.

Figure 5:
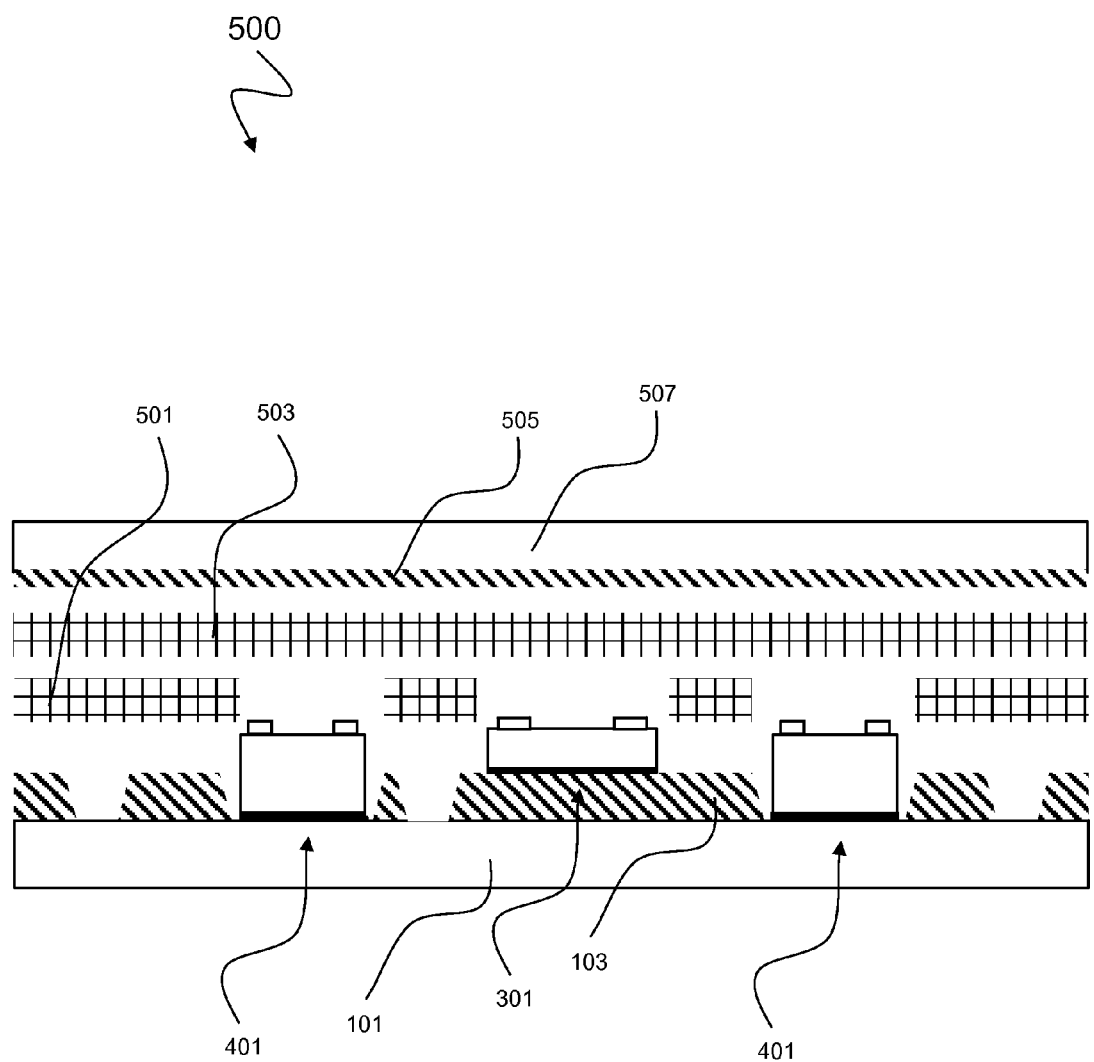

FIG. 5 schematically illustrates an exemplary act 500 of forming a layup. After all dies 301, 401 are bonded either to the surface of the Cu foil 103, e.g. by diffusion soldering or isolation glue die attach for the thin dies 301, or inside the etched cavity 209, e.g. by isolation glue die attach for the thick dies 401, the dies may be embedded in a material layer or core layer, e.g. by using a PCB (Printed Circuit Board) material to be prepared for the lamination process described below. An exemplary layup may contain e.g. the bottom Cu/Al foil 101, 103 with bonded dies 301, 401, two or more layers of structured prepregs 501, 503 and one top Cu/Al foil 505, 507. The prepreg layers 501, 503 may be structured e.g. with a UV laser cutting process. At least one first (or bottom) prepreg layer 501 may contain cavities for all components and also for all necessary pin holes. At least one second (or top) prepreg layer 503 may contain only the required pin holes. To minimize the warpage and to make the structure as symmetrical as possible, the top metal foil 505, 507 may be for example a Cu layer 505 having a thickness from about 9 μm (micrometer) to about 12 μm (micrometer) on top of an Al carrier 507 having a thickness of about 100 μm (micrometer). In one example, the top Al carrier 507 and the Cu layer 505 may have the same thickness than in the bottom Cu/Al layer 103, 101 where the dies 301, 401 are bonded.

The number of the insulation layers or prepregs may depend on the die thicknesses. In one example, a part or all of the insulation layers may be resin foils. In a further example, a part or all of the insulation layers may be laminates, e.g. built up by using adhesives. In yet another example, a part or all of the insulation layers may be resin foils and laminates (e.g. Cu foil-resin (bonding) film-laminate-resin (bonding) film-Cu foil). In one example, the foils and prepreg materials may be PCB (Printed Circuit Board) materials as e.g. used in high volume HDI (High-Density Interconnect) PCB production.

Figure 6:
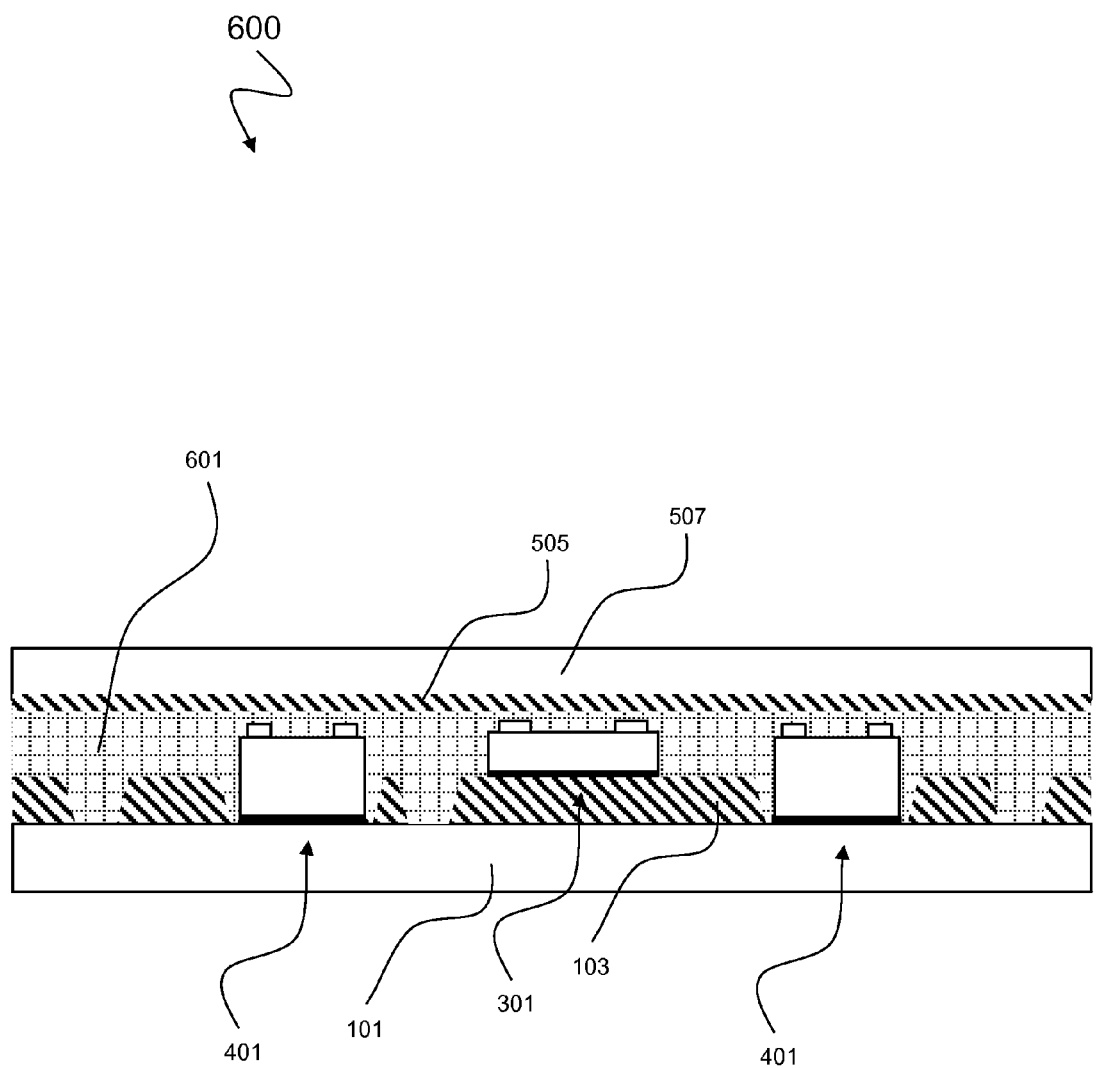

FIG. 6 schematically illustrates an exemplary lamination act 600 of the panel layup depicted in FIG. 5. The panel layup may be laminated by using a PCB vacuum lamination press. During a first phase in the lamination cycle the B-stage resin in the prepreg layers 501, 503 depicted in FIG. 5 may "melt" and may fill all the cavities on the structured Cu layer 103 and around the components 301, 401. The temperature may then increase over the temperature where the curing/cross linking process starts and may continue increasing until the resulting polymer 601 is fully cured.

Figure 7:
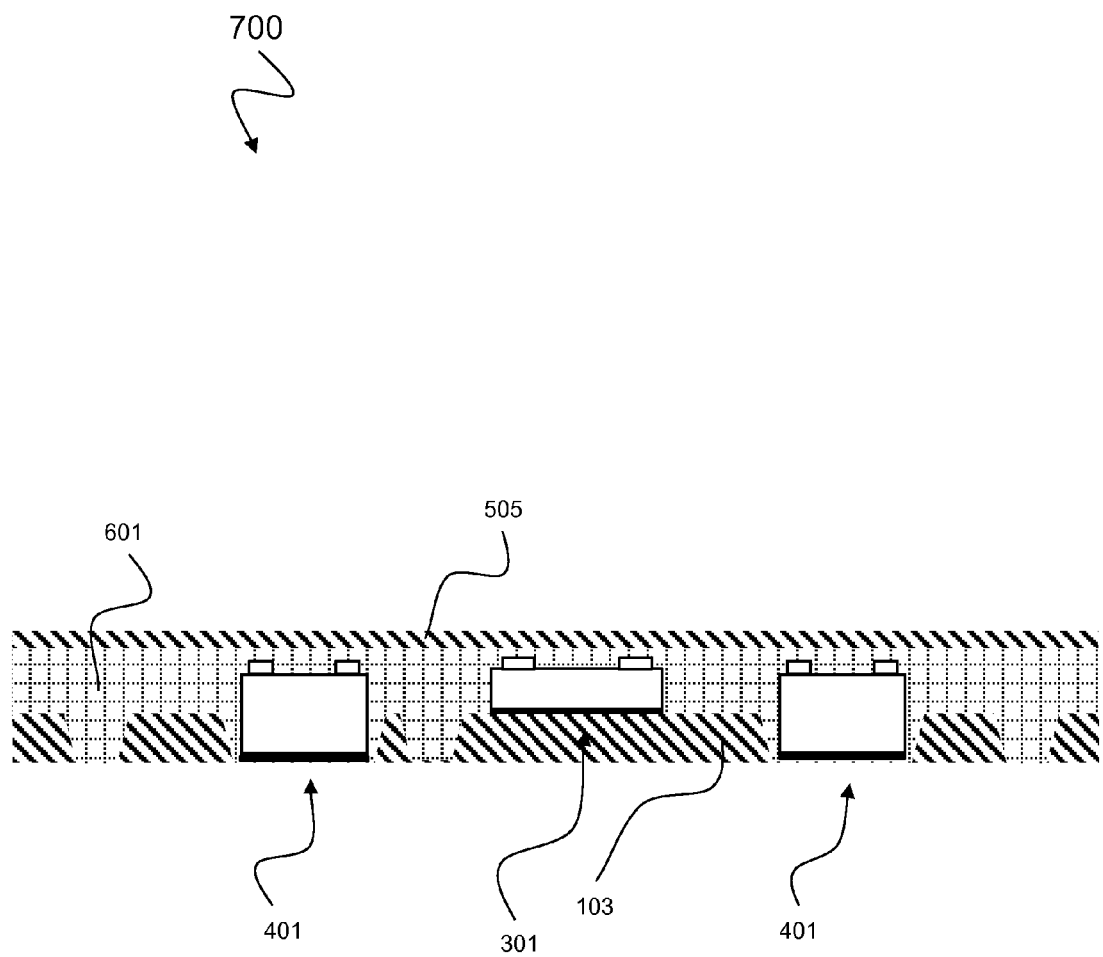

FIG. 7 schematically illustrates a carrier removal act 700. After the lamination act 600 depicted in FIG. 6, the carrier layers 101, 507 may be removed, for example by using an etching process. In case that the carrier foils 101, 507 are made of aluminum, the etching can e.g. be done by using heated Sodium Hydroxide (e.g. 50-70 g/l NaOH) etching solution, for example having a temperature of about 70° C. This etching solution may be selective without damaging the Cu layer(s) 103, 505 or the embedded dies 301, 401.

In one example, the carriers 101, 507 may be removed by pealing (e.g. for a Cu carrier) or by employing a wet etching process (e.g. for an Al carrier). In case of the Cu foil 103 being arranged on a Cu carrier 101, the pealing after the lamination can be performed with relatively low force. For the case of the carrier foils 103, 505 being made of aluminum, these can be removed by etching as described above. A panel after the carrier removal act 700 may include multiple semiconductor chips 301, 401 which may be arranged in the form of a grid.

Figure 8:
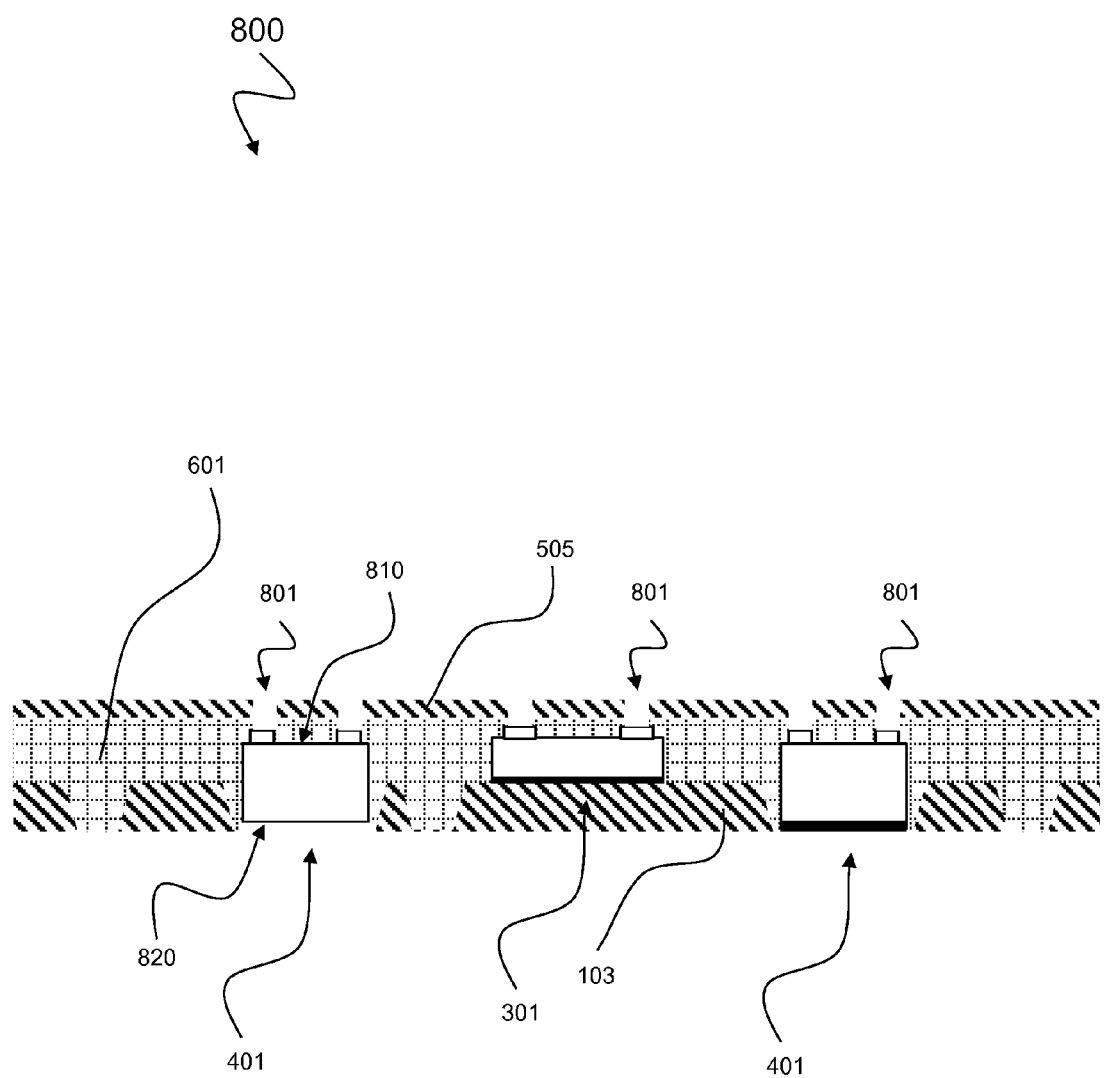

FIG. 8 schematically illustrates an exemplary act 800 of via manufacturing. The microvias 801 to the chip front side 810 of thick components 401 and thin components 301 may be manufactured in two phases. In a first phase the photo-resist may be coated on the surface and may then be opened, e.g. by using a lithography process and a development process. The microvia openings 801 to the seed Cu layer may be etched, e.g. by using a wet etching process. After the etching process, the cured prepreg resin 601 may be removed from the microvia openings 801, e.g. by using a $CO_2$ laser drilling process that may use the remaining Cu as a mask. In the second phase, the chip back side 820 of the thick components 401 may be opened, e.g. by using a $CO_2$ laser drilling process.

Figure 9:
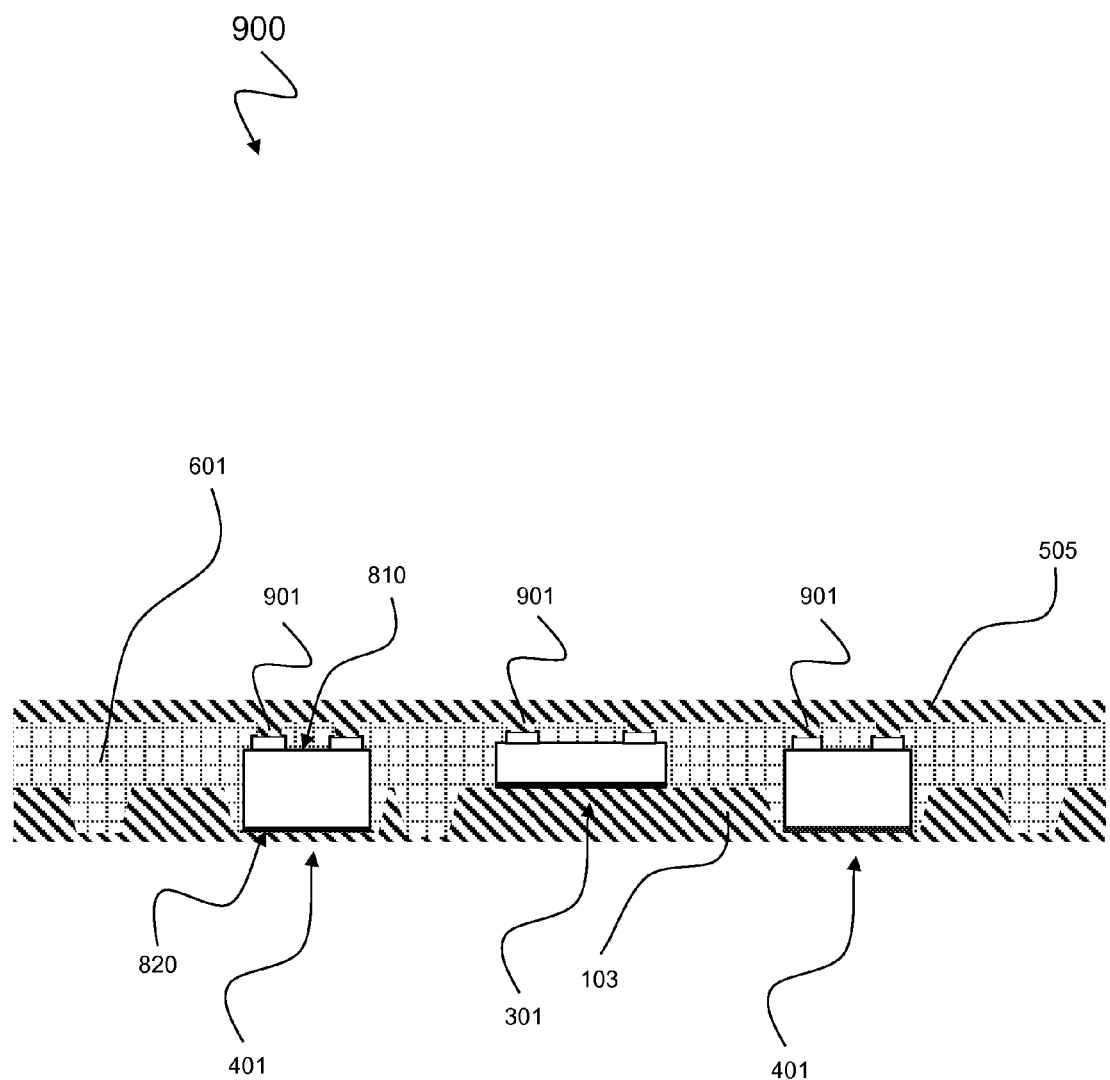

FIG. 9 schematically illustrates an exemplary act 900 of plating. The chip front side 810 of all, i.e. thin components 301 and thick components 401 and the back side 820 of the thick components 401 in case the back side connection is required may be connected to the conductor layers 505, 103, e.g. by first plating a thin seed layer, for example by using an electroless copper plating process and then continuing with the electrochemical plating process.

After the plating process the front side 810 of the thin and thick components 301, 401 may be electrically and metal-lurgically connected to the copper foil 505 and the back side 820 of the thick dies 401 may be connected to the embedded Cu structure 103.

Figure 10:
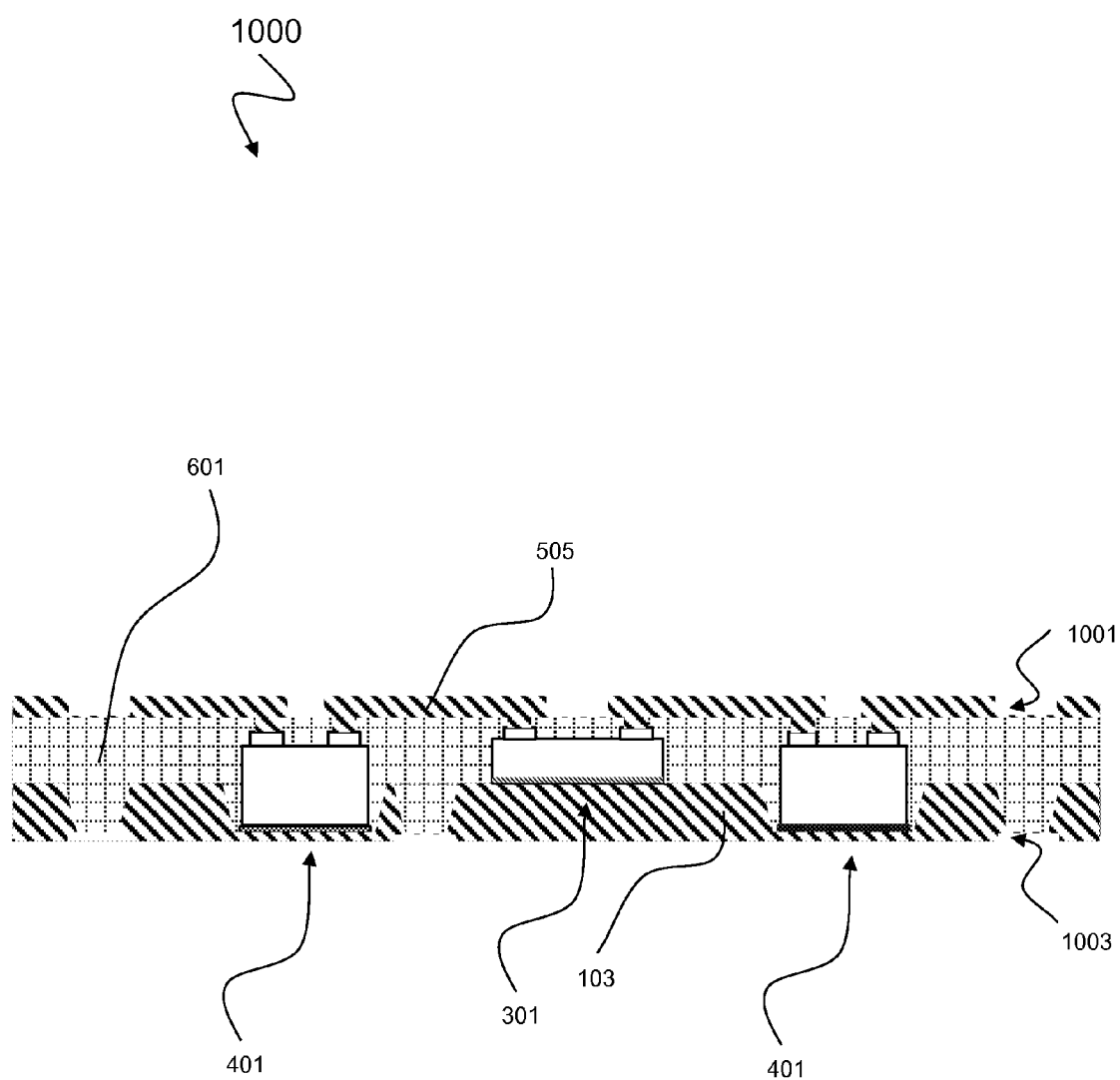

FIG. 10 schematically illustrates an exemplary act 1000 of conductor patterning. The conductor pattern may be manufactured by using a DES process as described in the following. First, a photoresist may be coated on both sides of the panel. The exposed and developed photoresist may be used as a mask during the etching process to form an upper conductor pattern 1001 over the front side 810 of the components 301, 401 and/or to form a lower conductor pattern 1003 over the back side 820 of the components 301, 401. In one example, a pattern plating process may be used in addition to a panel plating process.

In further examples, in which more routing capability may be needed, additional prepreg layers may be laminated on one or both sides of the module. After all PCB processes are finished a solder mask may be coated on both sides of the panel. Further process steps may be surface finishing, solder bumping and package separation.

A method with respect to the process blocks lithography 100, etching 200 and bonding 300 as described above with regard to FIGS. 1, 2 and 3 may include providing an electrically conductive foil 103 attached on a carrier 101, exposing at least one portion of the carrier 101 by removing at least one portion of the electrically conductive foil 103, and attaching a first semiconductor chip 301 to a non-removed portion of the electrically conductive foil 103. The first semiconductor chip 301 may include a first contact pad, e.g. a source or gate electrode, arranged over a first face of the first semiconductor chip 301 and a second contact pad, e.g. a drain electrode, arranged over a second face of the first semiconductor chip 301. The second contact pad may be electrically and/or thermally coupled to the electrically conductive foil 103.

A method with respect to the process blocks lithography 100, etching 200, bonding 300 and plating 900 as described above with regard to FIGS. 1, 2, 3 and 9 may additionally include forming a first electrically conductive layer 505 over the first semiconductor chip 301. The first contact pad 901 may be electrically coupled to the electrically conductive foil 103, e.g. by a through via not depicted in FIGS. 1 to 10.

The method may further include embedding the first semiconductor chip 301 at least partly in a non-conductive layer 601 between the carrier 101 and the first electrically conductive layer 505.

Attaching the first semiconductor chip 301 to the electrically conductive foil 103 may include one of the following connection techniques: soldering, diffusion soldering, diffusion bonding, conductive adhesive bonding, ultrasonic bonding and thermal compression. In one example, removing the at least one portion of the electrically conductive foil 103 may include using a first selective etchant configured to etch the electrically conductive foil 103. In one example, the method may include removing the carrier 101 after embedding the first semiconductor chip 301 in the non-conductive layer 601. In one example, removing the carrier 101 may include using a second selective etchant configured to etch the carrier 101. In one example, the electrically conductive foil 103 may contact the carrier 101 and an etch rate of the electrically conductive foil 103 may differ from an etch rate of the carrier 101. In one example, an etch stop layer may be arranged between the electrically conductive foil 103 and the carrier 101.

In one example, the method may include attaching a second semiconductor chip 401 to an exposed portion of the carrier 101. The second semiconductor chip 401 may include a first contact pad 901 arranged over a first face of the second semiconductor chip 401 and a second contact pad 820 arranged over a second face of the second semiconductor chip 401 opposite to the first face. The second contact pad 820 may be temporarily fixed to the carrier 101.

A method with respect to the process blocks lithography 100, etching 200, bonding 300 and die attaching 400 as described above with regard to FIGS. 1, 2, 3 and 4 may include providing an electrically conductive foil 103 attached on a carrier 101, exposing at least one portion of the carrier 101 by removing at least one portion of the electrically conductive foil 103, and attaching a first semiconductor chip 301 to a non-removed portion of the electrically conductive foil 103 and attaching a second semiconductor chip 401 to an exposed portion of the carrier 101. A first face of the first semiconductor chip 301 facing in a first direction opposite to the carrier 101 and a first face of the second semiconductor chip 401 facing in the first direction may be approximately located on a same height as further described below with respect to FIG. 11.

In one example, a height difference between the first face of the first semiconductor chip 301 and the first face of the second semiconductor chip 401 may be smaller than 40 μm (micrometer), in particular smaller than 10 μm (micrometer). In one example, a thickness of the first semiconductor chip 301 may lie in a range between 30 μm (micrometer) and 150 μm (micrometer). In one example, a thickness of the second semiconductor chip 401 may lie in a range between 150 μm (micrometer) and 550 μm (micrometer).

In one example, the method may include embedding the first semiconductor chip 301 and the second semiconductor chip 401 in at least one first material layer 501 including cavities corresponding to positions of the first semiconductor chip 301 and the second semiconductor chip 401 and covering the first semiconductor chip 301 and the second semiconductor chip 401 by at least one second material layer 503 as illustrated above with respect to FIG. 5. In one example, at least one of the at least one first material layer 501 and the at least one second material layer 503 may include a glass fiber reinforcement. In one example, the at least one first material layer 501 may include one of a molding resin and a filled polymer film.

Figure 11:
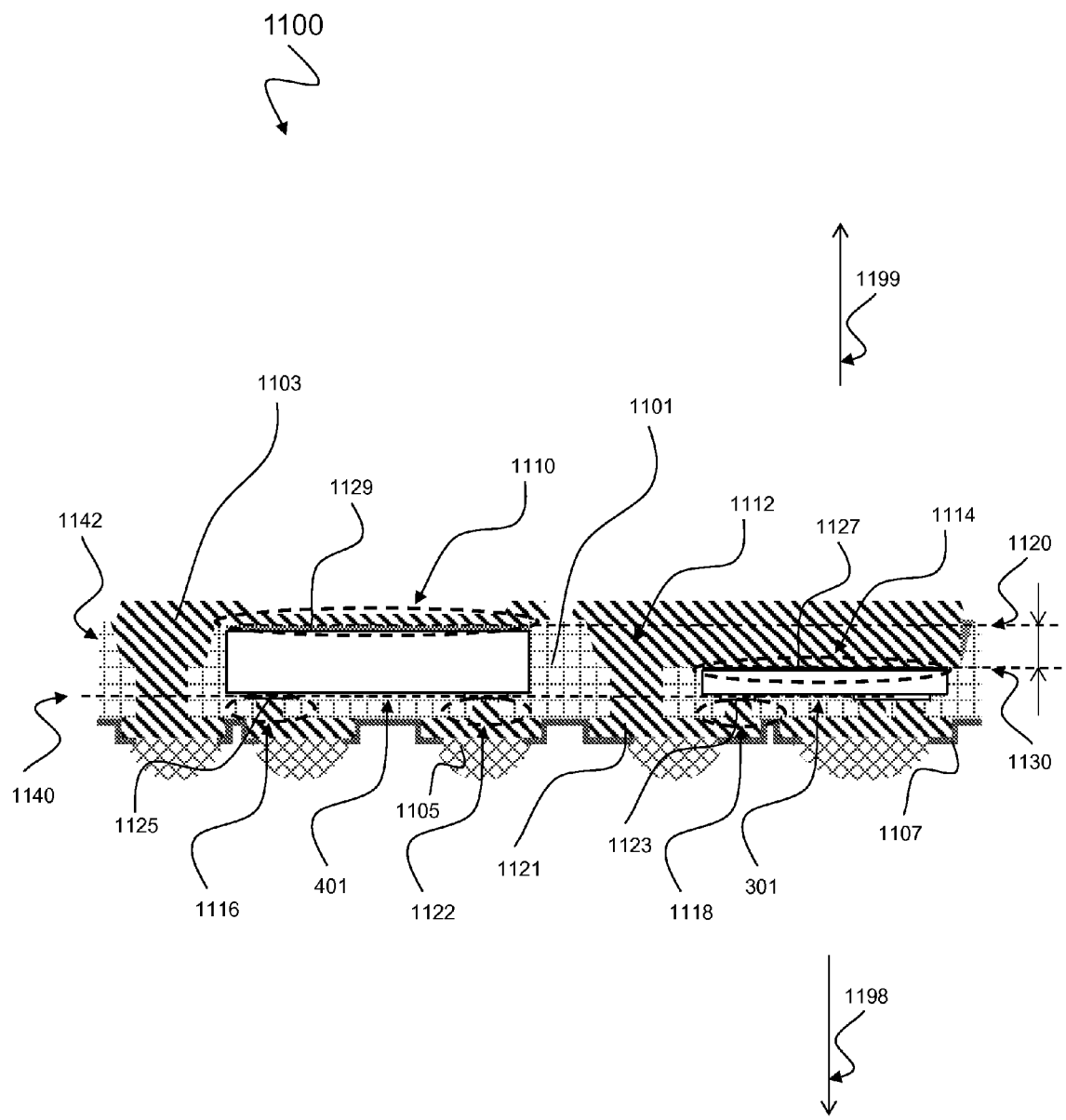
FIG. 11 schematically illustrates a cross-sectional view of a package 1100 embedding a two semiconductor chips.

FIG. 11 schematically illustrates a cross-sectional view of a package 1100 including a first semiconductor chip 301 and a second semiconductor chip 401.

The package or device 1100 may include a first semiconductor chip 301 having a first face facing in a first direction 1198 and a second face facing in a second direction 1199 opposite to the first direction 1198. The device 1100 may include a second semiconductor chip 401 located laterally outside of an outline of the first semiconductor chip 301. The second semiconductor chip 401 may have a first face facing in the first direction 1198, i.e. in the same direction as the first semiconductor chip 301 and a second face facing in the second direction 1199, i.e. in the same direction as the first semiconductor chip 301. The first face of the first semiconductor chip 301 and the first face of the second semiconductor chip 401 may be arranged on approximately a same height level, e.g. a first height level 1140 as depicted in FIG. 11. The second face of the first semiconductor chip 301 and the second face of the second semiconductor chip 401 may be arranged on different height levels, e.g. on a second height level 1130 and a third height level 1120, respectively as depicted in FIG. 11.

In one example, a first patterned electrically conductive layer 1121 may be arranged over the first face of the first semiconductor chip 301 and over the first face of the second semiconductor chip 401. The first patterned electrically conductive layer 1121 may be electrically coupled to a first contact pad 1123, e.g. a source or gate electrode, of the first semiconductor chip 301 by a first microvia 1118 and to a first contact pad 1125, e.g. a source or gate electrode, of the second semiconductor chip 401 by a second microvia 1116. The first microvia 1118 and the second microvia 1116 may have approximately a same thickness.

In one example, the first semiconductor chip 301 may include a power semiconductor and may be thinner than the second semiconductor chip 401. The second semiconductor chip 401 may include one of a power semiconductor and a driver semiconductor.

In one example, the second face of the first semiconductor chip 301 may include a metallurgical connection 1114 to electrically and/or thermally couple a second contact pad 1127, e.g. a drain electrode, arranged over the second face of the first semiconductor chip 301 to a second patterned electrically conductive layer 1103. The second face of the second semiconductor chip 401 may include a plated connection 1110 to electrically couple a second contact pad 1129, e.g. a drain electrode, arranged over the second face of the second semiconductor chip 401 to the second patterned electrically conductive layer 1103.

In one example, the first semiconductor chip 301 and the second semiconductor chip 401 may be at least partly embedded in a non-conductive layer 1101 between the first patterned electrically conductive layer 1121 arranged over the first faces of the first semiconductor chip 301 and the second semiconductor chip 401 and the second patterned electrically conductive layer 1103 arranged over the second faces of the first semiconductor chip 301 and the second semiconductor chip 401. In one example, the side walls 1142 of the package 1100 may be free of conductive material.

Contact bumps 1105 may be arranged on the first patterned electrically conductive layer 1121 for providing external contacts to the contact pads 1123, 1127, 1125, 1129 of the semiconductor chips 301, 401. An insulation layer 1107 may be arranged on the first patterned electrically conductive layer 1121 to isolate the device 1100 to the outside such that only the contact bumps 1105 are externally accessible. In one example, through-vias 1112 may be arranged through the non-conductive layer 1101 to electrically connect the first patterned electrically conductive layer 1121 with the second patterned electrically conductive layer 1103.

In a first exemplary configuration, the device 1100 may be a package which may include two power semiconductor chips of different thickness. In a second exemplary configuration, the device 1100 may be a package which may include a power semiconductor chip and a driver chip or a logic chip or a controller chip where the power semiconductor chip may be thinner than the latter one. In a third exemplary configuration, the device 1100 may be a package which may include two power semiconductor chips of different thickness and one of a driver chip, a logic chip and a controller chip which thickness approximately may correspond to the thickness of the thicker one of the two power semiconductor chips. The logic chip may include a switching logic semiconductor, a network semiconductor or a communication terminal semiconductor, for example.

The device 1100 may include a material layer 1101 in which the first semiconductor chip 301 and the second semiconductor chip 401 may be at least partly embedded. The material layer 1101 may include at least one of a prepreg, a resin, a laminate, an epoxy, a filled epoxy, glass fibers, an imide, a duroplast, a thermoplast and any other insulation layer.

The device 1100 may be manufactured by using the "embedding" process as described above with respect to FIGS. 1 to 10.

Figure 12:
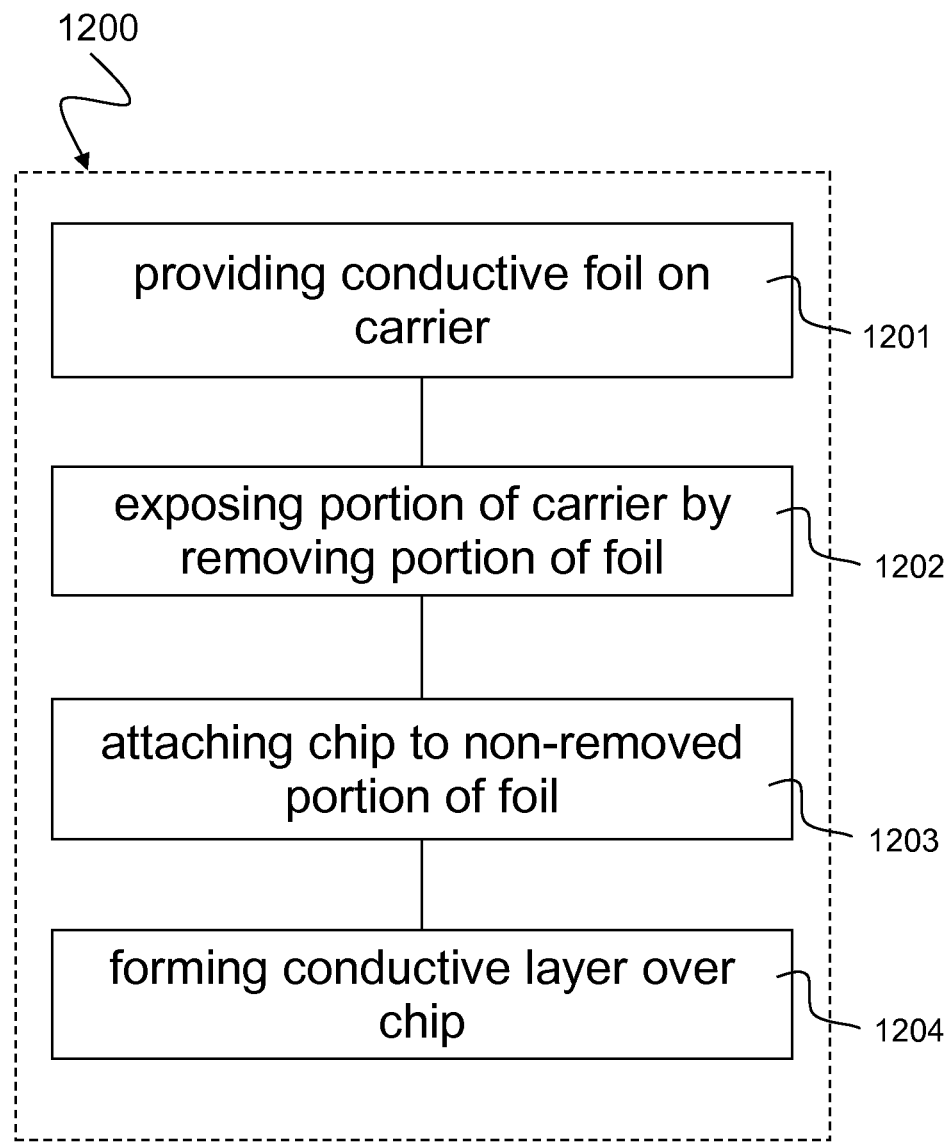
FIG. 12 schematically illustrates a method 1200 for manufacturing a device including a semiconductor chip.

FIG. 12 schematically illustrates a method 1200 for attaching a semiconductor chip to an electrically conductive foil. The method 1200 may include an act 1201 of providing an electrically conductive foil attached on a carrier. The method 1200 may include an act 1202 of exposing at least one portion of the carrier by removing at least one portion of the electrically conductive foil. The method 1200 may include an act 1203 of attaching a first semiconductor chip to a non-removed portion of the electrically conductive foil, wherein the first semiconductor chip may include a first contact pad arranged over a first face of the first semiconductor chip and a second contact pad arranged over a second face of the first semiconductor chip, and wherein the second contact pad may be electrically and/or thermally coupled to the electrically conductive foil. The method 1200 may include an act 1204 of forming a first electrically conductive layer over the first semiconductor chip, wherein the first contact pad may be electrically coupled to the first electrically conductive foil.

The act 1201 and the act 1202 may correspond to the process blocks lithography 100 and etching 200 as described above with respect to FIGS. 1 to 2. The act 1203 may correspond to the process block bonding 300 as described above with respect to FIG. 3. The act 1204 may correspond to the process blocks plating 900 and patterning 1000 as described above with respect to FIGS. 9 and 10.

Figure 13:
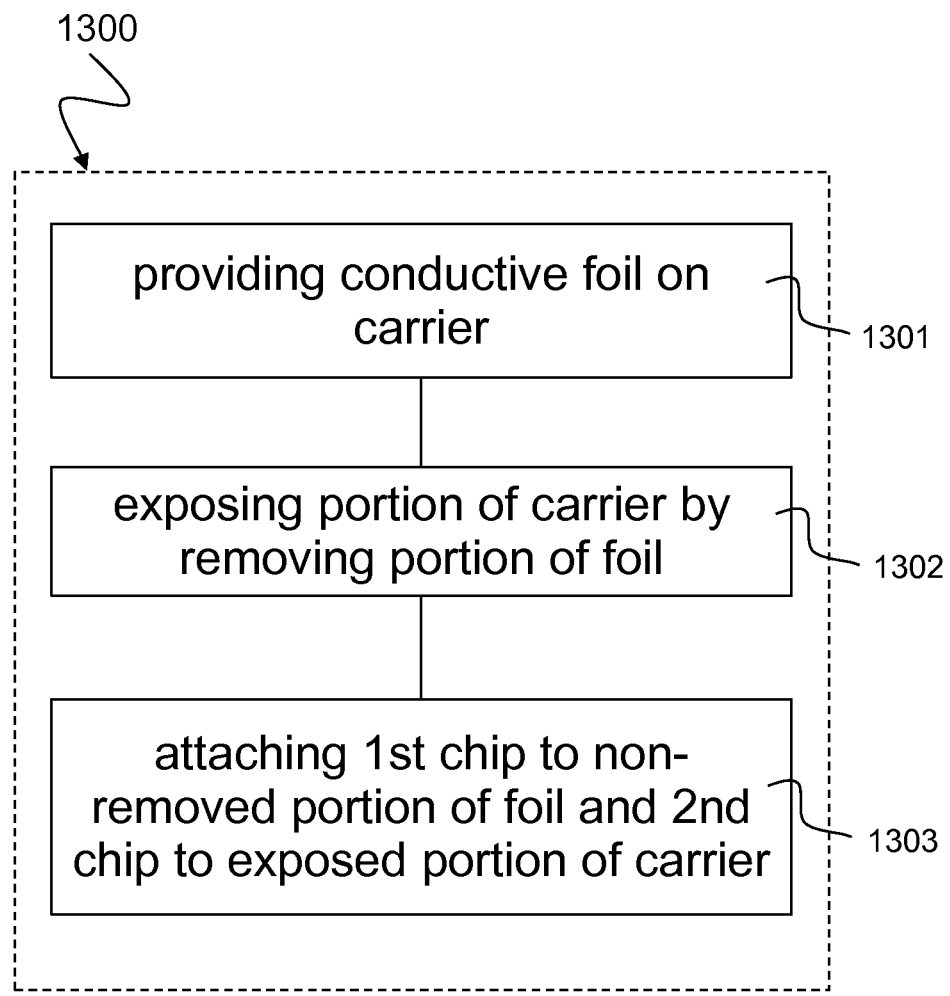
FIG. 13 schematically illustrates a method 1300 for manufacturing a device including two semiconductor chips.

FIG. 13 schematically illustrates a method 1300 for attaching two semiconductor chips of different thickness to an electrically conductive foil. The method 1300 may include an act 1301 of providing an electrically conductive foil attached on a carrier. The method 1300 may include an act 1302 of exposing at least one portion of the carrier by removing at least one portion of the electrically conductive foil. The method 1300 may include an act 1303 of attaching a first semiconductor chip to a non-removed portion of the electrically conductive foil and attaching a second semiconductor chip to an exposed portion of the carrier. A first face of the first semiconductor chip facing in a first direction opposite to the carrier and a first face of the second semiconductor chip facing in the first direction may be approximately located on a same height, e.g. within a few micrometers such as 1 to 3 µm (micrometer).

The act 1301 and the act 1302 may correspond to the process blocks lithography 100 and etching 200 as described above with respect to FIGS. 1 to 2. The act 1303 may correspond to the process blocks bonding 300 and die attaching 400 as described above with respect to FIGS. 3 and 4.

By using the process as described with respect to FIGS. 1 to 10, dies having different thicknesses may be embedded in the same package. The process disclosed herein may be accurate enough and capable for high volume and low cost production. The process disclosed herein may be used to manufacture cavities accurately to a conductive foil attached on a carrier, e.g. a copper foil attached on an Al carrier, with a selective etching process. The process may, for example, be used to diffusion solder thin dies on the surface of the Cu foil and to bond thick dies into the cavity that is etched into the Cu foil so that the die surfaces may be relatively accurately positioned on the same height.

By using the process as described above with respect to FIGS. 1 to 10 the surface of the dies does not necessarily have to be within few micrometer on a same height from the leadframe surface and there may be no limitations on the thickness of the dies with respect to the microvia sizes. The thick dies do not necessarily have to be embedded inside an accurately manufactured cavity on a leadframe. Instead, thick dies may be embedded in the package without influencing manufacture of the leadframe.

Therefore, manufacturing of accurately sized leadframe cavities having accurately defined depth and good surface quality for diffusion soldering for embedding the thick dies can be avoided. This may reduce design complexity and may guarantee low cost volume production. By using the process as described above, approaches like "half etching" experiencing worse surface quality/planarity and high depth variation and "mechanical/electrical discharge machining" which are too slow for low cost volume production of component packages may be avoided.

Using the process as described above with respect to FIGS. 1 to 10 may allow manufacturing cavities with accurately predefined depth by using selective etching process and conductive foils such as Cu/Al foils. These cavities can be used for embedding the thick dies so that the surface of the thick dies and the surface of the thin dies that are bonded on the surface of the Cu foil may be approximately on the same level allowing to use similar lamination process, microvia manufacturing process and plating process.

While a particular feature or aspect of an example of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that examples of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific examples have been illustrated and described herein, it will be appreciated by those of ordinary skill in the art that a variety of alternate and/or equivalent implementations may be substituted for the specific examples shown and described without departing from the concept of the present disclosure. This application is intended to cover any adaptations or variations of the specific examples discussed herein.

What is claimed is:

1. A method, comprising:
    providing an electrically conductive foil attached on a carrier;
    exposing at least one portion of the carrier by removing at least one portion of the electrically conductive foil to form at least one cavity in the electrically conductive foil;
    attaching a first semiconductor chip to a non-removed portion of the electrically conductive foil, wherein the first semiconductor chip comprises a first contact pad arranged over a first face of the first semiconductor chip and a second contact pad arranged over a second face of the first semiconductor chip, wherein the second face is opposite the first face, wherein the second contact pad is at least one of electrically or thermally coupled to the electrically conductive foil and wherein the first contact pad is electrically coupled to the electrically conductive foil;
    attaching a second semiconductor chip to an exposed portion of the carrier inside the at least one cavity;
    embedding the first semiconductor chip and the second semiconductor chip at least partially in a non-conductive layer arranged over the carrier; and
    after embedding the first semiconductor chip and the second semiconductor chip, forming a first electrically conductive layer over the first semiconductor chip and over the non-conductive layer.

2. The method of claim 1, comprising: embedding the first semiconductor chip at least partly in the non-conductive layer between the carrier and the first electrically conductive layer.

3. The method of claim 1, wherein the attaching the first semiconductor chip to the electrically conductive foil comprises one of the following connection techniques: soldering, diffusion soldering, diffusion bonding, conductive adhesive bonding, ultrasonic bonding, and thermal compression.

4. The method of claim 1, wherein removing the at least one portion of the electrically conductive foil comprises using a first selective etchant configured to etch the electrically conductive foil.

5. The method of claim 2, comprising: removing the carrier after embedding the first semiconductor chip in the non-conductive layer.

6. The method of claim 4, wherein removing the carrier comprises using a second selective etchant configured to etch the carrier.

7. The method of claim 1, wherein the electrically conductive foil contacts the carrier and an etch rate of the electrically conductive foil differs from an etch rate of the carrier.

8. The method of claim 1, wherein an etch stop layer is arranged between the electrically conductive foil and the carrier.

9. The method of claim 1, wherein the second semiconductor chip comprises a first contact pad arranged over a first face of the second semiconductor chip and a second contact pad arranged over a second face of the second semiconductor chip, and wherein the second contact pad of the second semiconductor chip is temporarily fixed to the carrier.

10. A method, comprising:
    providing an electrically conductive foil attached on a carrier;
    exposing at least one portion of the carrier by removing at least one portion of the electrically conductive foil to form at least one cavity in the electrically conductive foil;
    attaching a first semiconductor chip to a non-removed portion of the electrically conductive foil, the first semiconductor chip including a first contact pad arranged over a first face of the first semiconductor chip and a second contact pad arranged over a second face of the first semiconductor chip, wherein the second face is opposite the first face, and attaching a second semiconductor chip to an exposed portion of the carrier inside the at least one cavity;
    wherein the first face of the first semiconductor chip facing in a first direction opposite to the carrier and a first face of the second semiconductor chip facing in the first direction are approximately located at a same height from the carrier; and
    removing the carrier from the conductive foil.

11. The method of claim 10, wherein a height difference between the first face of the first semiconductor chip and the first face of the second semiconductor chip is smaller than 40 micrometers, or smaller than 10 micrometers.

12. The method of claim 10, wherein a thickness of the first semiconductor chip lies in a range between 30 micrometers and 150 micrometers; and wherein a thickness of the second semiconductor chip lies in a range between 150 micrometers and 550 micrometers.

13. The method of claim 10, comprising:
- embedding the first semiconductor chip and the second semiconductor chip in at least one first material layer comprising cavities corresponding to positions of the first semiconductor chip and the second semiconductor chip; and
- covering the first and second semiconductor chips by at least one second material layer.

14. The method of claim 13, wherein at least one of the at least one first material layer and the at least one second material layer comprises a glass fiber reinforcement.

15. The method of claim 13, wherein the at least one first material layer comprises one of a molding resin and a filled polymer film.

\* \* \* \* \*